US010481182B2

(12) United States Patent
Müller et al.

(10) Patent No.: US 10,481,182 B2
(45) Date of Patent: Nov. 19, 2019

(54) OPTICAL SENSOR WITH SPUN BIREFRINGENT SENSING FIBER

(71) Applicant: ABB Schweiz AG, Baden (CH)

(72) Inventors: Georg Müller, Glattpark (CH); Klaus Bohnert, Oberrohrdorf (CH); Andreas Frank, Zürich (CH); Lin Yang, Widen (CH)

(73) Assignee: ABB Schweiz AG, Baden (CH)

( * ) Notice: Subject to any disclaimer, the term of this patent is extended or adjusted under 35 U.S.C. 154(b) by 325 days.

(21) Appl. No.: 15/434,747

(22) Filed: Feb. 16, 2017

(65) Prior Publication Data

US 2017/0160315 A1    Jun. 8, 2017

Related U.S. Application Data

(63) Continuation of application No. PCT/EP2015/068956, filed on Aug. 18, 2015.

(30) Foreign Application Priority Data

Aug. 19, 2014   (EP) .................................... 14181456

(51) Int. Cl.
*G01R 15/24* (2006.01)

(52) U.S. Cl.
CPC ......... *G01R 15/245* (2013.01); *G01R 15/246* (2013.01)

(58) Field of Classification Search
CPC ............ G02B 6/29301; G02B 6/03694; G02B 6/3624; G02B 2006/12138; G01B 7/105;
(Continued)

(56) References Cited

U.S. PATENT DOCUMENTS 3,769,584 A    10/1973   Iten et al.
5,298,047 A *   3/1994   Hart, Jr. ................ C03B 37/027
                                                              65/432
(Continued)

FOREIGN PATENT DOCUMENTS

CN    101930019 A    12/2010
CN    102539873 A     7/2012
(Continued)

OTHER PUBLICATIONS

Laming et al., Electric Current Sensors Employing Spun Highly Birefringent Optical Fibers, 7 J. Lightwave Tech. 2084 (Dec. 1989) (Year: 1989).*

(Continued)

*Primary Examiner* — Tung X Nguyen
*Assistant Examiner* — Robert P Alejnikov, Jr.
(74) *Attorney, Agent, or Firm* — Taft Stettinius & Hollister LLP; J. Bruce Schelkopf (57) ABSTRACT

There is described an optical fiber current sensor having an opto-electronic module part for detecting an optical phase shift induced by the measurand field in a sensing fiber, a sensor head including the sensing fiber, wherein the sensing fiber is a spun highly-birefringent fiber having a length L=∫ ds defined by the line integral along the space curve given by the sensing fiber coil such that the length L of the sensing fiber is sufficiently long to suppress thermal signal instabilities due to the spun character of the sensing fiber while the effective number of fiber windings is low enough to maintain a maximum sensitivity over the full measurement range of the fiber-optical sensor.

26 Claims, 4 Drawing Sheets

(58) Field of Classification Search
CPC .. G01N 27/023; G01N 27/72; G01N 27/9046; G01N 17/00; G01N 21/00; G01N 2021/458; G01R 31/2648; G01R 33/0385; G01R 33/12; G01R 31/08; G01R 23/20; G01R 31/3183; G01R 27/2605; G01R 1/071; G01R 15/241; G01R 15/242; G01R 15/243; G01R 15/245; G01R 15/246; G01R 29/0885; G01R 33/032; G01R 33/0322; G01R 33/0325; G01R 33/0327; G01V 15/00; G01V 8/00; G01V 8/16; G01V 8/24; G08B 13/2408; G05B 23/0221; G02F 1/0036; G02F 1/0081; G02F 1/0128; G02F 1/09; G02F 1/091; G02F 1/092; G02F 1/093; G02F 1/095; G02F 1/0955; G02F 2001/094; B82Y 15/00; G01D 5/268; G01D 5/353; G01H 9/004; G01H 9/006; G01J 1/0425; G01J 3/0218; G01J 3/0221; G01J 3/0243; G01J 5/0818; G01J 5/0821; G01K 11/32; G01M 11/083; G01M 11/085; G01M 11/086; G01M 11/30; G01S 7/4818; G01T 1/201; G01L 1/242; G01L 1/243; G01L 1/245; G01L 1/246; H04B 10/07; H04B 10/0773; H04B 10/0775; H04B 10/0793; H04B 10/0795; H04B 2210/07; H04B 10/071; H04B 10/0771; H04B 10/0791; H04Q 2011/0083

USPC ........ 324/97, 233, 521, 522, 622, 650, 683, 324/709; 385/6, 12, 13; 398/9, 10, 13, 398/17, 20

See application file for complete search history.

(56) References Cited

U.S. PATENT DOCUMENTS

| | | | | |
|---|---|---|---|---|
| 5,386,484 | A * | 1/1995 | Ooka | G01C 19/722 385/11 |
| 6,023,331 | A * | 2/2000 | Blake | G01R 15/246 250/227.27 |
| 6,301,400 | B1 | 10/2001 | Sanders | |
| 6,611,337 | B1 | 8/2003 | Bassett et al. | |
| 7,003,184 | B2 * | 2/2006 | Ronnekleiv | A61B 5/01 385/12 |
| 7,602,198 | B2 | 10/2009 | Masri et al. | |
| 7,876,448 | B2 * | 1/2011 | Andersson | G01R 19/10 356/483 |
| 8,461,822 | B2 * | 6/2013 | Wueest | G01R 33/0322 250/227.11 |
| 8,624,579 | B2 * | 1/2014 | Chamorovskiy | G01R 15/246 250/227.17 |
| 2013/0093410 | A1 * | 4/2013 | Eriksson | G01R 15/242 324/96 |

FOREIGN PATENT DOCUMENTS

| | | | |
|---|---|---|---|
| CN | 203011982 U | 6/2013 | |
| DE | 4227903 C1 * | 7/1993 | .......... G01R 15/246 |
| DE | 4227903 C1 | 7/1993 | |
| EP | 2333498 A1 | 6/2011 | |
| EP | 2682765 A1 | 1/2014 | |
| JP | 2012242096 A | 12/2012 | |
| WO | 9610187 A1 | 4/1996 | |
| WO | 9858268 A1 | 12/1998 | |
| WO | 0163302 A2 | 8/2001 | |
| WO | 2007121592 A1 | 11/2007 | |
| WO | 2009103126 A1 | 8/2009 | |
| WO | 2011080696 A1 | 7/2011 | |

OTHER PUBLICATIONS

Kowal, et al., Measurement of birefringence and ellipticity of polarization eigenmodes in spun highly birefringent fibers using spectral interferometry and lateral point-force method, 26 Optics Express 34185, 34186 (Dec. 2018) (Year: 2018)*

Payne, et al., Fabrication and Properties of Low Birefringence Spun Fibers in Fiber-Optic Rotation Sensors and Related Technologies (Springer-Verlag Berlin Heidelberg 1982) (Year: 1982).*

Kim et al., Electromagnetic shielding properties of soft magnetic powder—polymer composite films for the application to suppress noise in the radio frequency range, 316 J. Magnetism and Magnetic Materials 472 (2007) (Year: 1997).*

European Patent Office, International Search Report & Written Opinion issued in corresponding Application No. PCT/EP2015/068956, dated Oct. 26, 2015, 11 pp.

European Patent Office, Extended Search Report issued in corresponding Application No. 14181456.6, dated Mar. 10, 2015, 7 pp.

Barlow et al., "Birefringence and polarization mode-dispersion in spun single-mode fibers," Applied Optics, vol. 20, No. 17, Sep. 1, 1981, pp. 2962-2968.

Bohnert et al., "Temperature and Vibration Insensitive Fiber-Optic Current Sensor," Journal of Lightwave Technology, vol. 20, No. 2, Feb. 2002, pp. 267-276.

Brifford et al., "Polarimetric Current Sensor Using an In-Line Faraday Rotator," IEICE Trans. Electron., vol. E83-C, No. 3, Mar. 2000, pp. 331-335.

Laming et al., "Electric Current Sensors Employing Spun Highly Birefringent Optical Fibers," Journal of Lightwave Technology, vol. 7, No. 12, Dec. 1989, pp. 2084-2094.

Papp et al., "Magnetooptical current transformer," Applied Optics, vol. 19, No. 22, Nov. 15, 1980, pp. 3729-3734.

Qian et al., "Spun linear birefringence fibres and their sensing mechanism in current sensors with temperature compensation," IEEE Proc-Optoelectron., vol. 141, No. 6, Dec. 1994, pp. 373-380.

National Intellectual Property Administration of the P.R. China, International Search Report & Written Opinion issued in corresponding Application No. PCT/CN2015/80056768.3, dated Dec. 9, 2018, 14 pp.

* cited by examiner

OPTICAL SENSOR WITH SPUN BIREFRINGENT SENSING FIBER

FIELD OF THE INVENTION

The invention relates to a fiber optic current sensor (FOCS) that includes a sensing fiber to be exposed to a magnetic field of a current to be measured, as typically used in high voltage or high current applications.

BACKGROUND OF THE INVENTION

Fiber-optic current sensors are based on the magneto-optic circular birefringence in an optical fiber that is coiled around the current conductor. This birefringence becomes manifest as a phase-shift between left and right circularly polarized light states which is accumulated along the sensing fiber. The total phase shift is proportional to the line integral of the magnetic field, which, in the case of a closed (or looped) sensing fiber coil where the two ends of the sensing fiber are in close spatial proximity, is simply proportional to the enclosed current I times number of fiber windings N.

More precisely, the magneto-optic phase shift between left and right circularly polarized light states amounts to 4VNI (fiber coil operated in a reflection-type sensor) or 2VNI (fiber coil operated in a transmission-type sensor), where V is the Verdet constant of the silica fiber. For example, $V \approx 1.0 \times 10^{-6}$ $A^{-1}$ at 1310 nm in fused silica fiber.

Different detection schemes and sensors exist to interrogate this phase-shift: Simple schemes work within a range $< \pm \pi/2$ [1, 2, 19], whereas more sophisticated closed-loop schemes often cover a range from $-\pi$ to $+\pi$ [3]. Accordingly, the number of sensor fiber windings around the current conductor determines the measurement range of the sensor in terms of current since a higher number of windings increases the magneto-optic phase shift and thus the signal-to-noise ratio, but reduces the maximum current that can be measured for the respective fixed range of detectable phase shifts. For instance, in the case of one fiber winding, the maximum detectable current at 1310 nm corresponds, for a maximum detectable phase shift of $\pi/2$ (or $\pi$), to roughly 390 kA (or 780 kA) for a current sensor operated in reflection. This current range can be further affected by non-linear sensor characteristics at high magneto-optic phase shifts.

Measurement of high electrical currents is conducted, e.g., in process control in the electro-winning industry as well as for protection against fault current and revenue metering in electrical power transmission.

Different types of sensing fiber are used in the known sensors. One particular fiber type is spun highly-birefringent fiber, which is produced by rotating the fiber preform of a linear birefringent fiber during the drawing process. Accordingly, the principal axes of the local linear birefringence rotate along the fiber, which introduces elliptical fiber birefringence and makes the near-circular polarization states of the light waves more robust against elasto-optic coupling and hence against perturbing external mechanical stress sources, but still maintains in a wide parameter range sufficient sensitivity to the magnetic field of the current. Thus, usage of spun highly-birefringent fiber as sensing fiber enables simplified packaging compared to a non- or low-birefringent sensing fiber. A spun highly-birefringent fiber is described by the local linear birefringence, for instance expressed by the linear beat length $L_{LB}$, which is a length section of equivalent unspun highly-birefringent fiber that produces a birefringent phase shift of $2\pi$, and the spin pitch p, which is the length of a spun highly-birefringent fiber section that provides a full revolution of principal axes of the local linear birefringence in the spun highly-birefringent fiber. As trade-off between good robustness and high current sensitivity, these parameters are often chosen so that the spinning ratio x is larger than unity:

$$x = \frac{2L_{LB}}{p} > 1$$

Due to the change of the birefringence of the fiber with temperature, the signal as a function of temperature of a fiber-optic current sensor employing spun highly-birefringent fiber can exhibit an oscillatory behavior. This is undesirable as it limits the accuracy of the sensor. It is well known that these instabilities can be sufficiently suppressed by usage of a broadband light source (center wavelength $\lambda$, full spectral width at half maximum (FWHM) $\Delta\lambda$) and a sensing fiber of a sufficient length L [4]. In case of a fiber-optic current sensor operated in reflection the sensing fiber length L best meets the following requirement:

$$2L > L_{EB} \frac{\lambda}{\Delta\lambda},$$

wherein $$L_{EB} = \frac{L_{LB}}{\sqrt{1+x^2} - x} \approx 2xL_{LB}$$

for $x>1$, see e.g. [4, 5]. Typical values are, for instance, $L_{LB}=10$ mm, p=5 mm, $\lambda=1310$ nm, and $\Delta\lambda=40$ nm so that $2L>1.3$ m. For a current sensor operated in transmission, the above expression becomes $$L > L_{EB} \frac{\lambda}{\Delta\lambda}.$$

Obviously, in both cases, this design rule of a certain minimum length of fiber enlarges the sensing coil diameter, if high electrical currents need to be detected, as only a small number of sensing coil windings are allowed in order to stay within the range of detectable magneto-optic phase shifts (e.g. within $<\pm\pi/2$ or $<\pm\pi$), respectively.

It is therefore seen as an object of the invention to provide optical sensors of the above kind, such as fiber-optic current sensors (FOCSs), that reduce adverse effects of fiber stress and simplify the assembly of the sensing fiber coil whilst avoiding reduction in sensor accuracy due to typical characteristics of spun highly-birefringent fiber (oscillatory component in sensor signal at changing temperature) and particularly whilst maintaining a high maximum detectable current for a given minimum length of spun highly-birefringent sensing fiber.

Unrelated to sensors which address the above object, a number of special sensing fiber arrangements for fiber-optic current sensors are known such as:

Designs for fiber-optic current sensors based on a Sagnac-interferometer with counter-propagating waves in the sensor fiber comprising a sensing fiber coil and, in order to reduce vibration sensitivity, a counter-wound fiber coil [6, 7, 8, 18]. As for example stated in Ref. [6], this form of compensation requires the same product of number of counter-wound windings or turns times the area enclosed by the loop or coil as that of the current sensing loop or coil, i.e NsAs=−NcAc (where "s" denotes the sensing coil and "c" denotes the compensation coil. This form of compensation is specific to Sagnac interferometers and not found in reflective interferometers, which are not prone to the Sagnac effect. It should be further noted that to be effective the compensation coil has to be oriented in the same plane as the sensing coil. In most embodiments, the compensation coil is made from a fiber section separated by an optical retarder from the sensing fiber coil.

In [18], also embodiments are disclosed with only partial compensation of the Sagnac effect, i.e. the above mentioned condition on the enclosed area is not fulfilled.

Sensor with two reflective fiber coils with opposite sense of fiber winding [9].

Current sensors comprising a first sensing fiber coil enclosing the primary current conductor and a second coil enclosing secondary electrical windings, wherein the secondary windings are part of a closed-loop feedback circuit to compensate the magneto-optic phase shift of the first coil [10].

Sensor heads with magnetic screening of the gap between the two ends of the sensor coil [11].

Fiber-optic current sensors to measure the sum or difference of the electrical currents carried in different conductors comprising more than one sensing fiber coil separated by optical retarders and non-sensitive optical fiber [12].

Fiber-optic current sensor with two fiber coils in planes orthogonal to each other, passed by a straight current conductor, with the purpose to eliminate influence of a fiber section with sensitivity to the magnetic field that varies along the length of the section [13].

An assembly for monitoring of a cable consisting of a first and a second fiber-optic leak current sensor, each comprising a first and a second current sensing coil with preferably the same number of fiber windings with opposite sense of rotation. First and second coil of the first sensor are concentrated at a first and a second end of the cable to be monitored. The first coil of the second sensor is concentrated at the first end, while the second coil is distributed over the cable [17].

SUMMARY OF THE INVENTION

According to a first aspect of the invention, there is a provided an optical fiber current sensor having an opto-electronic module part for detecting a magneto-optic phase shift induced in a sensing fiber by a magnetic field of the current and a sensor head including the sensing fiber, wherein the sensing fiber is a spun highly-birefringent fiber having a length $L = \int ds$ defined by the line integral along the space curve described by the sensing fiber, wherein a sensing length is defined as $L' = L$ for a transmission optical sensor (here in particular a transmission optical sensor using co-propagating light waves) and as $L' = 2L$ for a sensing fiber being terminated by a reflector, and $$L' > L_{EB} \frac{\lambda}{\Delta \lambda}$$

with $$L_{EB} = \frac{L_{LB}}{\sqrt{1+x^2} - x} \approx 2x L_{LB}$$

and x being the spinning ratio of the spun highly-birefringent fiber, $$\frac{\lambda}{\Delta \lambda}$$

the ratio or censer wavelength $\lambda$ over the spectral width $\Delta \lambda$ of the light in the sensing fiber (12), and $L_{LB}$ being the local linear birefringence of the spun highly-birefringent fiber, and wherein $$D = \sqrt{\frac{a^2 + b^2}{2}} < D_{max}$$

with $D_{max}$ being 50 cm or smaller and a and b being the two largest edge lengths of a cuboid of minimal size enclosing the sensing fiber, and the magneto-optic phase shift accumulated in the fiber is reduced by having at least one of the following features:

(i) one or more sections of the sensing fiber forming loops enclosing the current but being counter-wound with respect to other sections of the sensing fiber forming loops enclosing the current, (ii) one or more sections of the sensing fiber being at least partly magnetically shielded, and (iii) one or more sections of the sensing fiber forming loops not enclosing the current (i.e. current conductor).

In embodiments of the invention, the sensor head is connected by a polarization maintaining fiber to the opto-electronic module.

In embodiments, the sensor is not a transmission optical sensor using counter-propagating light waves. In further embodiments, the sensing fiber is terminated by a reflector, or the sensor is a transmission optical sensor using co-propagating light waves.

In embodiments, the sensing fiber has one or more sections forming loops enclosing the current or being designed for enclosing the current or a current conductor carrying the current.

In embodiments, the one or more sections of the sensing fiber forming loops enclosing the current mean in particular the one or more sections of the sensing fiber forming loops that are designed for enclosing the current or a current conductor carrying the current; and the one or more sections of the sensing fiber forming loops not enclosing the current mean in particular that the loops are not designed for enclosing the current or a current conductor carrying the current.

In another embodiment, the number of counter-wound loops enclosing the current differs from the number of not counter-wound loops enclosing the current.

Thus, there is provided an optical fiber current sensor having an opto-electronic module part for detecting an optical phase shift induced by a magnetic field in a sensing fiber, which module can include for example a light source, polarization means and an active or passive phase shift detection system, a sensor head including the sensing fiber connected by a polarization maintaining fiber to the optoelectronic module, wherein the sensing fiber is a spun highly-birefringent fiber having a geometrical length $L=\int ds$ defined by the line integral along the space curve given by the sensing fiber coil and an effective number of fiber windings $N_{eff}$ with an effective fiber length $L_{eff}$ associated with this effective number of fiber windings for given fiber coil dimensions, with $L_{eff} < L$, such that the geometrical length L of the sensing fiber is sufficiently long to suppress signal instabilities due to the spun character of the fiber while the effective number of fiber windings is low enough to achieve a sufficiently high maximum detectable current.

The magneto-optic phase shift being proportional to the measurand current is reduced by having one or more sections of the sensing fiber forming loops not enclosing the current to be measured, or by having one or more sections of the sensing fiber forming loops enclosing the current to be measured in the opposite sense compared to the remaining section(s) enclosing the current to be measured, or by having one or more sections of the sensing fiber being magnetically shielded or a combination of two or more of these sensitivity reducing elements. It should be noted that loops or coils can be simple folds in cases where the sensing fiber is not wound around a current conductor. However, in a preferred embodiment of this invention both ends of the sensing fiber are in close spatial proximity, in particular closer than 10 mm or even closer than 5 mm. In addition or as an alternative in case of magnetically shielded sensing fiber sections, an unshielded end of the sensing fiber is in close spatial proximity with a beginning of a magnetically shielded sensing fiber section.

A section of sensing fiber is defined as shielded from the current when the effect of the current or magnetic field to be measured is reduced at the location of this section, for example by enclosing the section of sensing fiber within a magnetic shielding material.

As mentioned in the introduction, additional loops of sensing fiber have so far been used only for sensors of the Sagnac-type interferometers (see ref. [6, 7, 8]), where additional loops of a counter-wound fiber coil with the condition NsAs=−NcAc are introduced into the optical path to compensate for vibrations.

In a variant of the invention, the sensor has an effective winding number $$N_{eff} = \frac{1}{|I|} \left| \int \vec{H} \cdot d\vec{s} \right|$$

fulfilling the condition $$N_{eff} < C \frac{L}{\pi D}$$

with $\int \vec{H} \cdot d\vec{s}$ being the line integral of the magnetic field vector H along the space curve (defined by vector space curve elements ds) of the sensing fiber coil (having geometrical length L), I being the current to be measured and |I| being the absolute value of the current to be measured, $$D = \sqrt{\frac{a^2 + b^2}{2}} < D_{max},$$

wherein a and b are the two largest edge lengths of a cuboid of minimal size enclosing the sensing fiber coil, $D_{max}$ being a length characterising the available volume for the sensor head, and $0 < C \leq 1$ being a numerical factor, in particular, $C=1$, 0.9, 0.8, 0.5, or 0.3.

The above aspects are best applied in cases in which the volume available to the sensor head is restricted. Hence it is preferred to limit the maximum length $D_{max}$ to 50 cm or even 30 cm allowing the design of compact sensor heads.

The sensor fiber length L is such that $$2L > L_{EB} \frac{\lambda}{\Delta\lambda}$$

in case of sensing fiber being terminated by reflector, or $$L > L_{EB} \frac{\lambda}{\Delta\lambda}$$

in case of a transmission optical sensor.

In embodiments, the sensor fiber length L is such that $$2L > 2L_{EB} \frac{\lambda}{\Delta\lambda}$$

in case of sensing fiber being terminated by reflector, or $$L > 2L_{EB} \frac{\lambda}{\Delta\lambda}$$

in case of a transmission optical sensor.

In a particularly preferred variant of this embodiment, the lower limit of the length L is chosen such that expected amplitudes K of (thermal) signal instabilities in the sensing fiber determined in accordance with $$K = x^{-2} \exp - \frac{\pi^2}{4\ln 2} \left( \frac{2L\Delta\lambda}{L_{EB}\lambda} \right)^2$$

for a reflective configuration or in accordance with $$K = x^{-2} \exp - \frac{\pi^2}{4\ln 2} \left( \frac{L\Delta\lambda}{L_{EB}\lambda} \right)^2$$

for a sensor operated in transmission, with K being below 0.5% or even below 0.1% of the average signal, and with x being the spinning ratio and being in the range of 1 to 20, or in particular of 2 to 10.

It is further preferred that the effective winding number $N_{eff}$ is a small positive integer number, in particular $N_{eff}=1$ or $N_{eff}=2$.

It should be understood that the section of sensing fiber with the length L is preferably a single uninterrupted piece of fiber. It is in particular preferred that the spin pitch p or the periodicity of the sensing fiber is constant along the length L, and/or that the sensing fiber properties are homogenous along the length L. Thus in this embodiment of the invention, sensing fibers are excluded in which the section of the fiber having the length L is made of two or more distinct sections of fiber whether spliced together or interrupted by sections of fibers of a different kind or further optical elements such as retarders.

Elements as referred to above are preferably integrated into a sensor of the reflective type, i.e. wherein the sensing fiber is terminated by a reflector.

However, the elements can also be used for a sensor of the transmission type, in particular transmission optical sensors using co-propagating light waves.

The magnetic shield is preferably made of magnetically soft materials such as nickel iron alloys (e.g. $Ni_{80}Fe_{20}$), cobalt iron alloys, and amorphous magnetic alloys.

Elements as described above can be integrated into the sensor with a phase detection system including an active phase modulator or a passive optical element for introducing a phase bias between wave modes. Such phase detection systems are known per se.

The above and other aspects of the present invention together with further advantageous embodiments and applications of the invention are described in further details in the following description and figures.

DETAILED DESCRIPTION

The embodiments of fiber-optic current sensors employing the sensing fiber arrangements disclosed in the following comprise a broadband light source, such as a superluminescent diode, a light emitting diode, or a fiber light source, a signal processing unit comprising one or more photodetectors and further optical elements to detect the magneto-optic phase shift induced in the sensing fiber. These optical elements can comprise an electro-optic modulator in the case of interferometric current sensors [3] or only passive optical elements, such as-retarders, polarizers, and Faraday rotators in the case of simpler polarimetric detection schemes [1, 2].

Typically, the probe light is transferred to the sensor head via a section of polarization maintaining (PM) fiber. In many sensor configurations, a superposition of orthogonal linearly polarized light waves is guided by this PM fiber and converted to left and right circularly polarized light waves or close to left and right circular polarized by a retarder at the entrance to the sensing fiber. Left and right circularly polarized light waves encounter a differential magneto-optical phase shift in the sensing fiber. A reflector at the far end of the sensing fiber reflects the incoming light waves which swaps their helicity so that the magneto-optic phase shifts further accumulate at the return path. The retarder at the sensing fiber entrance converts the returning light waves back to linear (or close to linear) light polarizations.

Since light polarizations are swapped on the return path, the linear birefringent phase shift in the PM fiber is compensated on the return path and the phase difference of the returning light waves is only given by the magneto-optic phase shift.

Other embodiments of current sensors rely on a coherent superposition of left and right circular light waves in the sensing fiber, i.e. linear or close to linear polarized light. In this case, the PM fiber only transfers light waves of one linear light polarization to the sensing fiber. The magneto-optic phase shift results here in a rotation of the linear light polarization. Herein, a retarder between the sensing fiber and the PM fiber is not necessarily used.

In the following, embodiments of the disclosed invention are described for sensor heads used in the fiber-optic current sensors as described above consisting of a PM fiber lead, an optional retarder, and a spun sensing fiber terminated by a reflector. The disclosed invention can directly be applied to further embodiments of fiber-optic current sensors employing sensor heads operated in reflection or in transmission, such as fiber-optic current sensors based on a Sagnac interferometer [3], current sensors employing a 3×3 coupler [14] or simple polarimetric current sensors operated in transmission [15].

Figure 1A:
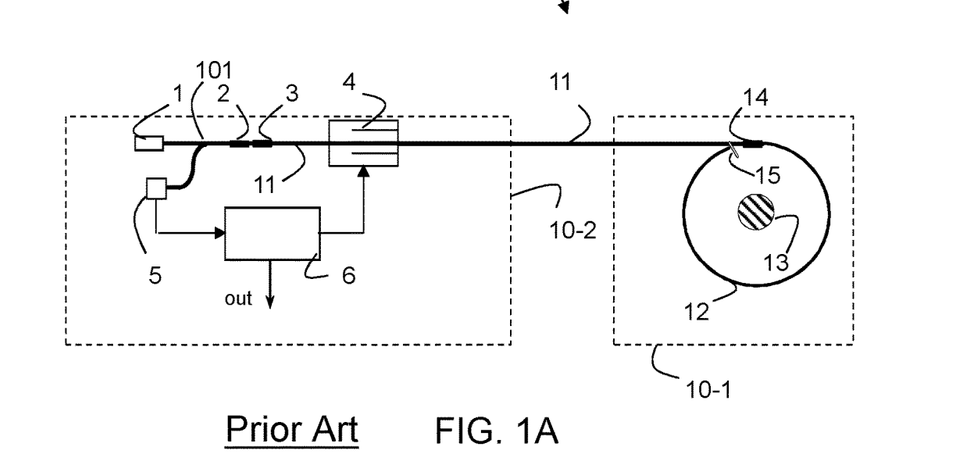
FIG. 1A is schematic diagram of known components of a fiber optic current sensor.

Hence, in FIG. 1A there is shown the example of a configuration of an optical current sensor employing a signal detection scheme with non-reciprocal phase modulation. For further details and possible modifications of the known elements of FIG. 1A reference can be made to [3].

In a fiber-optic current sensor design with non-reciprocal phase modulation as shown in FIG. 1A, light is injected, preferably from a low coherent light source 1 such as a superluminescent diode, after passing through an optical fiber, a fiber coupler 101 and an initial optical fiber polarizer 2, which reduces the emitted light into a single linear polarized state, injected at a 45° fiber splice 3 into both orthogonal polarization states of the PM fiber 11, which in turn are projected onto circular or close to circular light states in the sensing fiber 12 by a fiber-optic retarder 14. The two light states in the sensing fiber acquire a magneto-optic phase delay due to the applied electrical current (Faraday effect). The phase delay is detected by means of a closed-loop detection circuit that includes an optical phase modulator 4 and a detector 5 linked to the optical path with the fiber coupler 101. The optical phase modulator 4 and the detector 5 are also electrically linked through a signal processor 6 for the closed loop detection. Alternatively, an open-loop detection circuit may be used.

It should be understood that in these as in the following examples components cited can be replaced by components with identical or similar functionality. For example, the light source mentioned can be replaced by other types of light sources such as light emitting diodes (LEDs), edge-emitting LEDs, vertical-cavity surface-emitting lasers (VCSELs), doped-fiber light sources, or laser diodes. Similarly, the modulator 4 of FIG. 1A may for example be an integrated-optic birefringence modulator, such as a lithium niobate modulator, or a piezoelectric modulator.

Most components of the sensor with the exception of the components of the sensor head 10-1 and parts of the PM fiber 11 are shown as part of an opto-electronic module 10-2. The opto-electronic module 10-2 and the sensor head 10-1 are optically connected through the PM fiber 11. The sensor head 10-1 includes the part of the sensor surrounding the current conductor 13. The differential magneto-optic phase between circular polarization states for a single pass through the sensing fiber is calculated according to $$\varphi = 2\int ds\, VH,$$

wherein V is the Verdet constant of the sensing material and H is the magnetic field component parallel to the infinitesimal fiber section ds (and the integral is over the sensing fiber length L). In the case of a closed line integral, i.e. if the sensing fiber describes a closed loop, the integral of the magnetic field corresponds according to Maxwell's equations to the enclosed electrical current, i.e. in the case of a fiber-optic current sensor operated in transmission with light waves only co-propagating in one direction or in case of a comparative design of a Sagnac interferometer based current sensor with counter-propagating light waves $\varphi = 2NVI$ (with N being the number of fiber windings), or in case of a reflective current sensor wherein the light propagates twice along the magnetic field:

$\varphi = 4NVI$.

Ineffective or less effective sections of sensing fiber are added to the sensor head to increase the sensing fiber length while keeping the boundary conditions of limited space and of a required maximum detectable current, which in turn results in allowed maximum number of effective fiber windings. In mathematical terms, the number of effective fiber windings is defined as $$N_{\mathit{eff}} = \frac{1}{|I|}\left|\int \vec{H} \cdot d\vec{s}\right|$$

with the integration path being along the sensing fiber L. The effective length $L_{\mathit{eff}}$ follows from $N_{\mathit{eff}}$ and the sensing fiber loop diameter. Ineffective or less effective sections of sensing fiber are, as disclosed in the following paragraphs, arranged in a way that they do not contribute or contribute less to the magneto-optic phase shift even though they can be in close spatial proximity to the measurand electrical current I. In particular, the effective number Neff of fiber windings is smaller than $$N_{\mathit{eff}} < C\frac{L}{\pi D}$$

Herein, $0 < C \leq 1$ being a numerical factor, in particular, C=1, 0.9, 0.8, 0.5, 0.3. Furthermore, $$D = \sqrt{\frac{a^2 + b^2}{2}} < D_{max},$$

wherein a and b are the two largest edge lengths of a cuboid of minimal size enclosing the sensing fiber coil, $D_{max}$ being a length characterising the available volume for the sensor head. The quantities a and b are indicated in the relevant figures where appropriate. Note that in a case of a simple prior art circular arrangement of the sensing fiber, D is the diameter of the sensing fiber coil. Accordingly, this aspect of the invention facilitates fiber-optic current sensor coils with a given number of effective fiber windings that have a longer sensing fiber than conventional prior art circular sensor coils with the same dimension and a number of fiber windings corresponding to the effective number of fiber windings in accordance with this aspect of the invention.

Electricity metering in high voltage power transmission often requires sensor accuracy within ±0.2%. The mentioned signal oscillations stemming from the spun highly-birefringent fiber then should be significantly smaller than ±0.2%. e.g. <±0.05%. Using Refs [4, 5, 16] as a basis, it can be derived that the amplitude of the signal instabilities described in the prior art section are given for a reflective sensor by $$K = x^{-2}\exp-\frac{\pi^2}{4\ln 2}\left(\frac{2L\Delta\lambda}{L_{EB}\lambda}\right)^2$$

In case of a sensor operated in transmission, this expression becomes:

$$K = x^{-2}\exp-\frac{\pi^2}{4\ln 2}\left(\frac{L\Delta\lambda}{L_{EB}\lambda}\right)^2$$

Assuming fiber parameters as given in the prior art section above, the fiber length L must then be longer than 1625 mm. If one further assumes that currents up to 150 kA must be detected (for example over-currents in case of faults), a maximum sensing coil diameter due to limited space of 150 mm, a range of detectable magneto-optic phase shifts between $-\pi/2$ and $+\pi/2$, a wavelength of operation of 1310 nm (and corresponding Verdet constant), the fiber coil can only have 2 effective loops, corresponding to 942 mm of fiber, in order not to exceed the measurement range at maximum current.

In the following, different embodiments of the disclosed invention are described in detail, wherein in the description and in the examples, where appropriate, the effective section of the sensing fiber 12 is denoted by numeral 12-1 while the ineffective or less effective section is denoted by numeral 12-2.

Figure 1B:
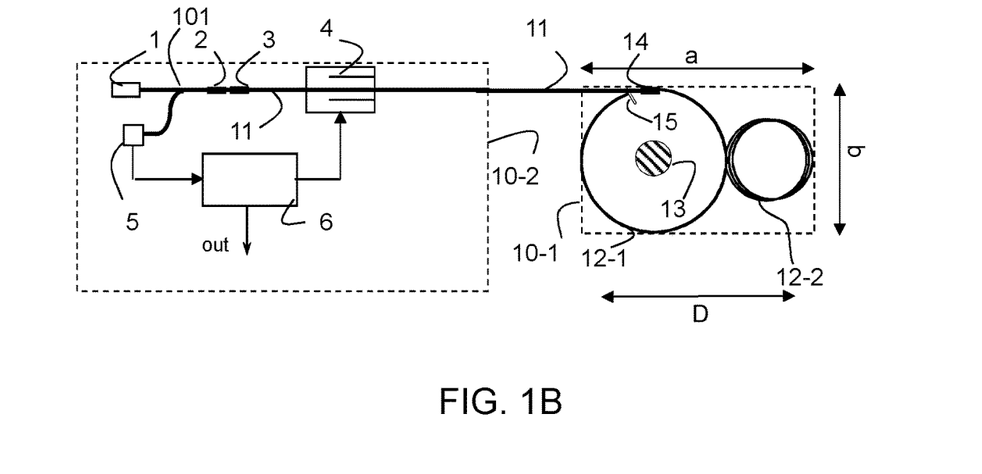
FIGS. 1B and 1C illustrate modifications to the sensor of FIG. 1A in accordance with examples of the invention with ineffective loops.
Figure 1C:
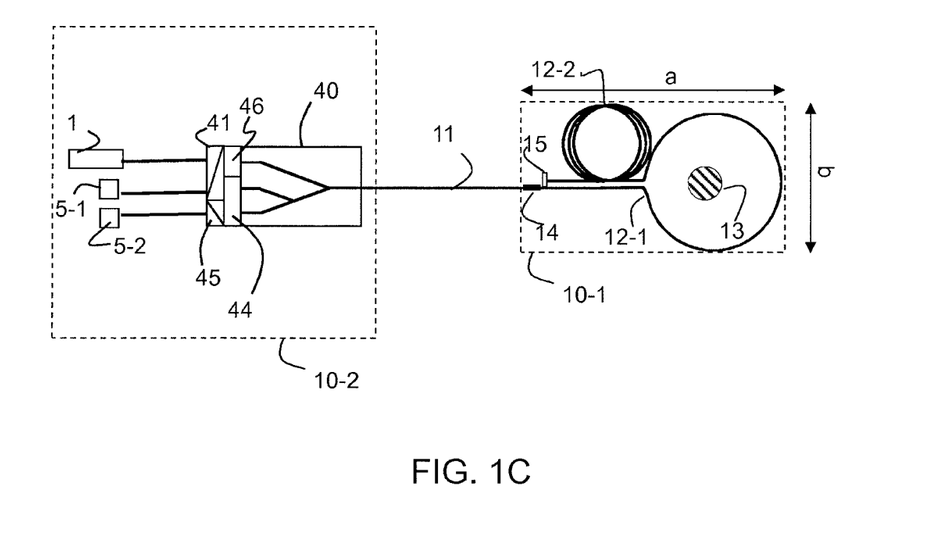

In a first embodiment, insensitive sensor windings are added to the sensing fiber 12 as shown in FIGS. 1B and 1G. As discussed previously, the magneto-optic phase shift of a closed sensing fiber loop corresponds to the enclosed current, and in particular wherein the magneto-optic phase shift in a closed sensing fiber loop not enclosing a current is zero.

According to the example above, e.g. three additional insensitive fiber windings of 100 mm diameter would ensure the required minimum fiber length L and result in the required signal stability. It should be noted that in this example the product of area and windings of the effective fiber loops differs from the same product of the ineffective fiber loops.

In FIGS. 1B and 1C, two examples of increasing the sensing fiber length L while maintaining the maximum detectable current (at a given maximum detectable magneto-optic phase shift) are shown. The effective number of sensing fiber windings is only determined by the fiber loops enclosing the current conductor 13.

To achieve independence of the signal of the specific geometry, both ends of the sensing fiber 12 need to be in close spatial proximity.

In the example of FIG. 1B, the elements of the opto-electronic module 10-2 using a nonreciprocal phase detection scheme are identical to those described when making reference to FIG. 1A. In the sensor head, fiber loops of the sensing fiber 12 are arranged in the shape of a figure-of-8 with the loops of the effective section 12-1 of sensing fiber surrounding the current conductor 13 and the loops of the ineffective section 12-2 of sensing fiber excluding the current conductor 13. The two loop diameters may be the same or may be chosen differently depending on the mechanical boundary conditions in the sensor application, in particular the available volume of the sensor head 10-1 as characterized by its lateral dimension $D_{max}$.

As mentioned, both ends of the sensing fiber are in close spatial proximity to each other. The two sets of loops of the figure-of-8 may be in a single plane or may be arranged at an angle to each other, e.g. orthogonal to each other.

Another fiber arrangement according to an example of the invention is shown in FIG. 1C. In the example of FIG. 1C the opto-electronic module 10-2 uses a phase detection scheme based on introducing a static optical phase bias between two parts or modes of the light passing through the sensing fiber.

In this example the opto-electronic module includes an integrated optical polarization splitter module to create a static bias optical phase shift, which in the example shown is based on an integrated-optic 1×3 splitter/combiner 40 (SC) forming the module together with the polarizers 41, 45 and retarder 44 and a spacer plate 46 attached to it. Light from the light source 1 enters into a first of three source side ports through the first polarizer 41 (P1), which polarizes the light at the entrance to the SC 40. Preferably, the polarization direction is at 45° with the respect to the normal of the SC plane. The waveguides within the SC 40 are of low birefringence in order not to alter the polarization state of the transmitted light.

At the opposite SC face (also referred to as coil-sided face) the light is coupled into the polarization-maintaining (PM) fiber pigtail 11. The principal axes of the PM fiber 11 are parallel and perpendicular to the SC plane, i.e. at 45° to the polarization direction of the polarizer P1 41. As a result both orthogonal polarization-modes of the PM fiber 11 are excited with the same amplitude.

The sensor head operates as already described above and the SC 40 splits the returning orthogonal light waves into two optical detection channels. A quarter-wave retarder plate (QWR) 44 at the source side face is used as the element to introduce a static bias optical phase shift, which in this example is a 90° differential phase delay between the orthogonal waves of both detection channels. The principal axes of the QWR 44 are aligned parallel to the axes of the PM fiber pigtail 11 and at 45° to polarizer P1 41.

The orthogonal waves of a first of the detector channels interfere at the polarizer 41 (which is in this example common to the light source channel and the first detector channel). The orthogonal waves of the second detector channel interfere at a second polarizer 45. The polarization direction of 45 is at 90° to that of 41. The intensity of the light in the two channels are detected by photo-detectors 5-1 and 5-2.

Note that SC 40 need not be located in proximity to the light source 1 and detectors 5-1 and 5-2 but may be located close to sensor head 10-1 or even in common housing with sensor head 10-1.

In the example of FIG. 1C, the sensor head 10-1 includes loops forming the effective section 12-1 of the sensing fiber which surround the current conductor 13 and loops forming the ineffective section 12-2 of sensing fiber which exclude the current conductor 13. Compared to the example of FIG. 1B, the loops are arranged as two separate coils.

In the examples of FIGS. 1B and 1C the length of the sensing fiber has been extended to be near to or to exceed the length required to suppress thermal instability below the required limit (see above) by adding sections 12-2 of sensing fiber which do not enclose the current conductor 13.

However, Faraday-ineffective length of sensing fiber can also be added using sections which loop around the current conductor 13. Such variants of the present invention are advantageous in cases where the available space within the sensor head, i.e. the space around the current conductor(s), provides only little space for folding or looping the fibers in a volume spaced apart from the location of the current conductor 13.

Figure 2A:
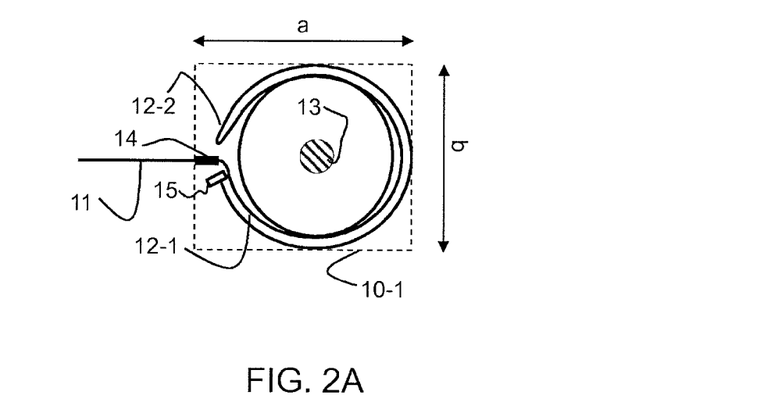
FIGS. 2A and 2B illustrate examples of further variants of the invention with loops of negative contributions to the sensor signal.
Figure 2B:
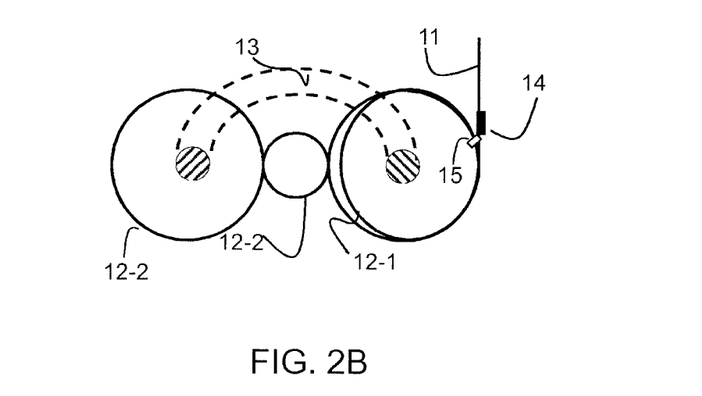

In the examples of FIGS. 2A and 2B, it is exploited that the sign of the detected phase shift depends on propagation direction of the light waves in the sensing fiber 12 with respect to the magnetic field direction and thus on the sense of the fiber winding with regard to the current direction. Accordingly, in the example of FIG. 2A the sensing fiber windings around the conductor 13 includes two sets of loops 12-1 and 12-2. The (Faraday-)ineffective section is composed of a number of loops with winding sense as the effective section and an equal number of fiber windings with opposite winding sense such that the total magneto-optic phase shift is reduced, as the phase shifts in these two sections cancel each other.

In different embodiments of the invention, the two counter-wound coils can be arranged within the same plane or could be stacked on top of each other. In the latter case, the reversal loop is orthogonal to the coil plane. In the first arrangement, the reversal loop can be either within the plane or orthogonal to the plane of the coil. Both ends of the sensor fiber require to be in close spatial proximity.

Using the same assumptions as in the previous example, e.g. 3 fiber windings of 150 mm diameter in one sense of rotation and 1 counter-wound sensing fiber winding of 150 mm diameter, could be used to fulfill the sensor requirements.

As illustrated in the example of FIG. 2B, the same effect can be achieved by reversing the direction of the current conductor 13 between two sets of loops 12-1, 12-2 while maintaining the direction in which the loops of the two sections are wound. In the example of FIG. 2B, a bow-tie shaped sensing fiber arrangement consisting of three distinct sections is used. The two outer sections 12-1, 12-2 of sensing fiber are wound around the conductor 13 before and after it is bent into a 180 degree turn, respectively, but are wound in the same direction.

In a third variant the reduction of magneto-optic phase shift can be achieved by reducing the magnetic field sensed by at least part of the sensing fiber. In this variant the full length of the sensing fiber 12 can again be wound around the conductor 13 (as in the examples of FIGS. 2A and 2B), however, the winding for the effective section 12-1 and the ineffective section 12-2 are wound in the same sense around the current conductor 13 (with the current flowing in the same direction).

Figure 3A:
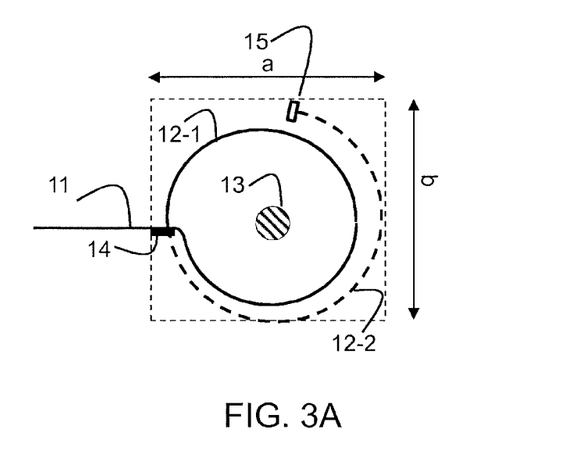
FIGS. 3A and 3B illustrate examples of further variants of the invention with magnetic shielding.
Figure 3B:
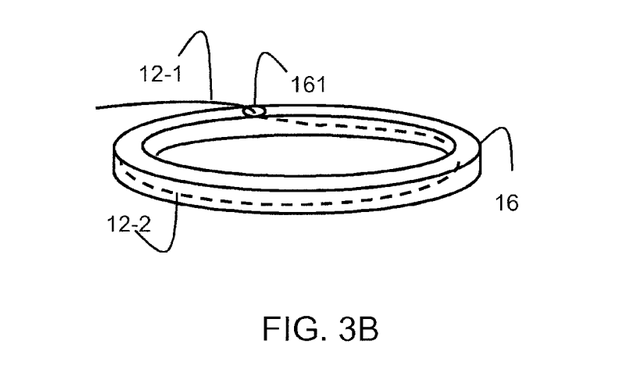

The effective shielding can be achieved by having at least parts of sensing fiber 12-2 that are magnetically shielded and thus contribute less or do not contribute at all to the detected magneto-optic phase shifts as illustrated in FIGS. 3A and 3B. It can also be achieved by splitting the conductor 13 into two or more parallel sections and winding the sensing fiber around just one of the sections.

In FIG. 3A the dashed part 12-2 of the sensing fiber is rendered insensitive to the magnetic field through a shield such as the hollow toroid 16 shown in FIG. 3B made of a shielding material.

Suitable materials for shielding are ferromagnetic materials of high magnetic permeability and low coercivity, so-called magnetically soft materials such as nickel iron alloys (e.g. Ni80Fe20), cobalt iron alloys, and amorphous magnetic alloys. The magnetic shield 16 can be designed as toroid with an inlet 161 for the sensing fiber (as depicted in FIG. 3B) or as a tube. To achieve a sufficiently high magnetic screening the design can be optimized by means of electro-magnetic finite element calculations. The unshielded loops 12-1 must form a closed coil. In embodiments, the shielded fiber loops 12-2 are also closed to guarantee sensor signals independent of the conductor geometry even in the case of low magnetic screening.

With the assumption as used in the previous examples above, the sensor requirements can e.g. be met by 2 unscreened and 2 screened sensor windings of 150 mm diameter. A moderate screening factor of 100 is sufficient. Alternatively, a fully shielded sensing fiber forming four windings can be used with a shield of screening factor of 2.

Another aspect or comparative example relates to an optical fiber current sensor 10 having an opto-electronic module part 10-2 for detecting a magneto-optic phase shift induced in a sensing fiber 12 by a magnetic field of the current, a sensor head 10-1 including the sensing fiber 12 and connected by a polarization maintaining fiber 11 to the opto-electronic module 10-2, wherein the sensing fiber 12 is a spun highly-birefringent fiber having a length L=∫ ds defined by the line integral along the space curve described by the sensing fiber such that in case of a transmission optical sensor using counter-propagating lightwaves:

$$L > L_{EB} \frac{\lambda}{\Delta\lambda}$$

and wherein the magneto-optic phase shift accumulated in the fiber is reduced by having at least one of (i) one or more sections 12-2 of the sensing fiber forming loops enclosing the current but being counterwound with respect to other sections 12-1 of the sensing fiber forming loops enclosing the current, (ii) one or more sections 12-2 of the sensing fiber being at least partly magnetically shielded, and (iii') one or more sections of the sensing fiber forming loops not enclosing the current conductor with, when counter-wound with respect to sections 12-1 of the sensing fiber forming loops enclosing the current, the product of the number of counter-wound windings or turns times the area enclosed by the loop or coil is not equal to that of the current sensing loops or coil, with $$L_{EB} = \frac{L_{LB}}{\sqrt{1+x^2} - x} \approx 2xL_{LB}$$

and x being the spinning ratio of the spun highly-birefringent fiber, $$\frac{\lambda}{\Delta\lambda}$$

the ratio or center wavelength λ over the spectral width Δλ of the light in the sensing fiber (12), and $L_{LB}$ being the local linear birefringence of the spun highly-birefringent fiber.

Embodiments are as disclosed for the cases of the sensing fiber being terminated by a reflector or the transmission optical sensor using co-propagating lightwaves.

REFERENCES

[1] WO2007/121592A1

[2] F. Briffod et al., "Polarimetric current sensor using in-line Faraday rotator", IEICE Trans. Electron. E83-C, 331 (2000).

[3] K. Bohnert et al., "Temperature and vibration insensitive fiber-optic current sensor", J. Lightw. Technol. 20, 267 (2002).

[4] R. I. Laming and D. N. Payne, "Electric current sensors employing spun highly-birefringent optical fibers", J. Lightw. Technol. 7, 2084 (1989).

[5] J. R. Qian et al., "Spun linear birefringence fibres and their sensing mechanism in current sensors with temperature compensation", IEE Proc.-Optoelectron. 141, 373-380 (1994).

[6] U.S. Pat. No. 6,301,400 B1

[7] WO 01/63302 A2

[8] CN 101930019 A

[9] CN 102539873 A

[10] WO 96/10187

[11] U.S. Pat. No. 7,602,198 B2

[12] U.S. Pat. No. 7,876,448 B2

[13] CN 203011982 U

[14] U.S. Pat. No. 6,611,337 B1

[15] A. Papp and H. Harms, "Magnetooptical current transformer. 1: Principles", Applied Optics, 19, 3729, 1980.

[16] Barlow et al., "Birefringence and polarization mode-dispersion in spun single-mode fibers", Appl. Opt. 20, 2962 (1981).

[17] DE 42 27 903 C1.

[18] WO 2009/103126 A1.

[19] EP 2 682 765 A1.

LIST OF REFERENCE NUMERALS 1 light source
101 fiber coupler
2 optical fiber polarizer
3 45° fiber splice
4 optical phase modulator
40 integrated-optic 1×3 splitter/combiner (SC)
41, 45 polarizer
44 phase shift plate
46 spacer
5, 5-1, 5-2 detector
6 signal processor
10 fiber-optical current sensor
10-1 sensor head
10-2 opto-electronic module
11 polarization maintaining fiber
12 sensing fiber
12-1 sensing fiber (effective section)
12-2 sensing fiber (ineffective section)
13 conductor
14 optical retarder
15 reflector
16 magnetic shield
161 inlet

The invention claimed is:

1. An optical fiber current sensor having an opto-electronic module part for detecting a magneto-optic phase shift induced in a sensing fiber by a magnetic field of the current, and a sensor head including the sensing fiber, wherein the sensing fiber is a spun highly-birefringent fiber having a length $L=\int ds$ defined by the line integral along the space curve described by the sensing fiber, wherein a sensing length is defined as $L'=L$ for a transmission optical sensor and as $L'=2L$ for a sensing fiber being terminated by a reflector and $$L' > L_{EB}\frac{\lambda}{\Delta\lambda}$$

with $$L_{EB} = \frac{L_{LB}}{\sqrt{1+x^2}-x} \approx 2xL_{LB}$$

and x being the spinning ratio of the spun highly-birefringent fiber, $$\frac{\lambda}{\Delta\lambda}$$

the ratio of center wavelength $\lambda$ over the spectral width $\Delta\lambda$ of the light in the sensing fiber, and $L_{LB}$ being the linear beat length which is a length section of equivalent unspun highly-birefringent fiber that produces a birefringent phase shift of $2\pi$, and
wherein $$D = \sqrt{\frac{a^2+b^2}{2}} < D_{max},$$

with $D_{max}$ being 50 cm or smaller and $D_{max}$ being a length characterising the available volume for the sensor head, and a and b being the two largest edge lengths of a cuboid of minimal size enclosing the sensing fiber, wherein
the magneto-optic phase shift accumulated in the fiber is reduced by having at least one of the following features:
(i) one or more sections of the sensing fiber forming loops enclosing the current but being counter-wound with respect to other sections of the sensing fiber forming loops enclosing the current,
(ii) one or more sections of the sensing fiber being at least partly magnetically shielded, and
(iii) one or more sections of the sensing fiber forming loops not enclosing the current.

2. The sensor of claim 1, wherein the sensor head is connected by a polarization maintaining fiber to the opto-electronic module.

3. The sensor according to claim 1, wherein the sensor is not a transmission optical sensor using counter-propagating light waves.

4. The sensor according to claim 1, wherein the sensing fiber being terminated by a reflector.

5. The sensor according to claim 1, wherein the sensor is a transmission optical sensor using co-propagating light waves.

6. The sensor according to claim 1, wherein the sensing fiber has one or more sections forming loops enclosing the current or being designed for enclosing the current or a current conductor carrying the current.

7. The sensor according to claim 1, wherein the one or more sections of the sensing fiber forming loops enclosing the current are designed for enclosing the current or a current conductor carrying the current; and/or the one or more sections of the sensing fiber forming loops not enclosing the current are designed for not enclosing the current or a current conductor carrying the current.

8. The sensor according to claim 1, wherein the number of counter-wound loops enclosing the current differs from the number of not counter-wound loops enclosing the current.

9. The sensor according to claim 1, having an effective winding number $$N_{eff} = \frac{1}{|I|}\left|\int \vec{H}\cdot d\vec{s}\right|$$

with $$N_{eff} < C\frac{L}{\pi D}$$

wherein $\int \vec{H}\cdot d\vec{s}$ is the line integral of magnetic field vector H along the space curve defined by the sensing fiber over the sensing fiber length L, I being the current and |I| the absolute value of the current to be measured, and C being a numerical factor with $0<C\le 1$.

10. The sensor according to claim 1, wherein both ends of the sensing fiber are closer than 10 mm of each other.

11. The sensor according to claim 1, wherein, in the case of a magnetically shielded sensing fiber section an unshielded end of the sensing fiber is closer than 10 mm with a beginning of the magnetically shielded sensing fiber section.

12. The sensor according to claim 1, wherein the length L of the sensing fiber is such that expected amplitudes K of sensor signal instabilities determined in accordance with $$K = x^{-2}\exp-\frac{\pi^2}{4\ln 2}\left(\frac{2L\Delta\lambda}{L_{EB}\lambda}\right)^2$$

for a reflective sensor configuration, or with $$K = x^{-2}\exp-\frac{\pi^2}{4\ln 2}\left(\frac{L\Delta\lambda}{L_{EB}\lambda}\right)^2$$

or a sensor configuration operated in transmission,
with K being below 0.5% of the average signal, and with the spinning ratio x being in the range of 1 to 20.

13. The sensor according to claim 1, having an integer number as an effective winding number $$N_{eff} = \frac{1}{|I|}\left|\int \vec{H}\cdot d\vec{s}\right|$$

wherein $\int \vec{H} \cdot d\vec{s}$ is the line integral of magnetic field vector H along the space curve defined by the sensing fiber, I being the current to be measured and |I| being the absolute value of the current to be measured.

14. The sensor according to claim 13, wherein $N_{\it{eff}}$ being 1 or 2.

15. The sensor according to claim 1, wherein the spin pitch (p) of the sensing fiber is constant along the sensing fiber length L.

16. The sensor according to claim 15, wherein the sensing fiber properties are homogenous along the sensing fiber length L.

17. The sensor according to claim 1, wherein the spin pitch (p) is between 1 mm and 20 mm.

18. The sensor according to claim 1, wherein the spinning ratio (x) is between 1 and 20.

19. The sensor according to claim 1, wherein $D_{max}$ is 30 cm or smaller.

20. The sensor according to claim 1, wherein a magnetic shield for shielding sections of the sensing fiber is made of magnetically soft materials.

21. The sensor according to claim 20, wherein the magnetically soft materials is selected from the group consisting of: nickel iron alloys (e.g. Ni80Fe20), cobalt iron alloys, and amorphous magnetic alloys.

22. The sensor according to claim 1, wherein the phase detection includes an active phase modulator.

23. The sensor according to claim 1, wherein the phase detection includes passive optical elements for introducing a phase bias between the interfering light waves.

24. The sensor according to claim 1, wherein $L_{LB}$ is the linear beat length which is a length section of equivalent unspun highly-birefringent fiber that produces a birefringent phase shift of $2\pi$; and/or wherein the spinning ratio x of the spun highly-birefringent fiber is given by $$x = \frac{2L_{LB}}{p},$$

wherein $L_{LB}$ is the linear beat length which is the length of equivalent unspun highly-birefringent fiber that produces a birefringent phase shift of $2\pi$, and p is the spin pitch which is the length of a spun highly-birefringent fiber section that provides a full revolution of principal axes of the local linear birefringence in the spun highly-birefringent fiber.

25. The sensor according to claim 1, wherein the magneto-optic phase shift accumulated in the fiber is reduced by having one or more sections of the sensing fiber forming loops not enclosing the current, and the one or more sections of the sensing fiber forming loops not enclosing the current are designed for not enclosing the current or a current conductor carrying the current.

26. The sensor according to claim 1, wherein the magneto-optic phase shift accumulated in the fiber is reduced by having one or more sections of the sensing fiber being at least partly magnetically shielded, and an unshielded end of the sensing fiber is closer than 10 mm with a beginning of the magnetically shielded sensing fiber section.

* * * * *